US008253756B2

(12) United States Patent
Lee et al.

(10) Patent No.: US 8,253,756 B2
(45) Date of Patent: Aug. 28, 2012

(54) CIRCUIT FOR PERFORMING DITHERING ON PIXELS OF A DISPLAY AND METHOD THEREOF

(75) Inventors: Yu-Ju Lee, Taoyuan County (TW); Tzu-Chiang Shen, Taoyuan County (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 546 days.

(21) Appl. No.: 12/616,788

(22) Filed: Nov. 12, 2009

(65) Prior Publication Data

US 2011/0012918 A1 Jan. 20, 2011

(30) Foreign Application Priority Data

Jul. 16, 2009 (TW) ............................... 98124081 A

(51) Int. Cl.

| | |
|---|---|
| ***G09G 5/00*** | (2006.01) |
| ***G09G 9/02*** | (2006.01) |
| ***H04N 11/02*** | (2006.01) |
| ***H03M 1/12*** | (2006.01) |
| ***G06F 15/00*** | (2006.01) |
| ***G06K 15/00*** | (2006.01) |
| ***G06K 9/36*** | (2006.01) |
| *G06K 1/00* | (2006.01) |
| *G06K 9/00* | (2006.01) |
| *G06K 9/40* | (2006.01) |
| *H04N 5/202* | (2006.01) |
| *H04N 1/40* | (2006.01) |

(52) U.S. Cl. ........ 345/596; 345/581; 345/601; 345/606; 345/690; 348/254; 348/384.1; 348/538; 348/574; 358/1.9; 358/3.13; 358/3.23; 358/448; 382/166; 382/232; 382/254; 382/274

(58) Field of Classification Search .................. 345/581, 345/589, 596, 600–601, 605–606, 547–549, 345/204, 690; 348/251–254, 268, 384.1, 348/513, 524, 537–538, 574, 630; 358/1.9, 358/3.13, 3.16, 3.23, 447–448, 162, 166, 358/232, 235, 237, 254

See application file for complete search history.

(56) References Cited

U.S. PATENT DOCUMENTS

| | | | | |
|---|---|---|---|---|
| 5,301,269 | A * | 4/1994 | Alcorn et al. | 345/599 |
| 6,008,796 | A * | 12/1999 | Vaswani et al. | 345/442 |
| 6,266,449 | B1 * | 7/2001 | Ohsawa | 382/239 |
| 2002/0191224 | A1 * | 12/2002 | Yagishita et al. | 358/426.07 |
| 2007/0070423 | A1 * | 3/2007 | Kakutani | 358/3.01 |
| 2008/0239351 | A1 * | 10/2008 | Yada | 358/1.9 |

* cited by examiner

*Primary Examiner* — Wesner Sajous
(74) *Attorney, Agent, or Firm* — Winston Hsu; Scott Margo

(57) ABSTRACT

A circuit dithers pixel data on a display, and includes a lookup table module, a dithering parameter decoder, a first adder, a second adder, and an overflow handling module. A lookup table of the lookup table module stores dithering parameters generated by encoding odd and even pixel dithering parameters. The dithering parameter decoder generates second and third dithering parameters corresponding to odd and even pixels from a first dithering parameter. The first adder generates a dithered odd pixel parameter according to the odd pixel parameter and the second dithering parameter. The second adder generates a dithered even pixel parameter according to the even pixel parameter and the third dithering parameter. The overflow handling module checks for overflow, and generates an output odd pixel parameter according to the dithered odd pixel parameter, and generates an output even pixel parameter according to the dithered even pixel parameter.

18 Claims, 7 Drawing Sheets

Table 1

| Pixel Number | 1 | 2 | 3 | 4 | ..... | 1917 | 1918 | 1919 | 1920 |
|---|---|---|---|---|---|---|---|---|---|
| Pixel Count | 0 | | 1 | | ... | 0 | | 1 | |

Table 2

| Line Number | 1 | 2 | 3 | 4 | ..... | 1197 | 1198 | 1199 | 1200 |
|---|---|---|---|---|---|---|---|---|---|
| Line Count | 0 | 1 | 2 | 3 | ... | 0 | 1 | 2 | 3 |

Table 3

| Frame Number | 1 | 2 | 3 | 4 | 5 | 6 | 7 | 8 |
|---|---|---|---|---|---|---|---|---|
| Frame Count | 0 | 1 | 2 | 3 | 0 | 1 | 2 | 3 |

FIG. 4

CIRCUIT FOR PERFORMING DITHERING ON PIXELS OF A DISPLAY AND METHOD THEREOF

BACKGROUND OF THE INVENTION

1. Field of the Invention

The present invention relates to circuits and related methods for performing dithering on pixel data in a display, and more particularly to a circuit and related method for integrating a lookup table used by odd pixels and even pixels for reducing memory and logic gates required for performing dithering on the pixel data displayed in the display.

2. Description of the Prior Art

Dithering is a technique used when a display needs to display colors (or a color palette) not displayable by the display. By utilizing dithering, the display may display the non-displayable colors by mixing colors displayable by the display. Please refer to FIG. 1, which is a diagram of a dithering circuit 100 utilized in the prior art. As shown in FIG. 1, the dithering circuit 100 comprises a pixel counter 102, a line counter 104, a frame counter 106, a data segmenting module 108, a lookup table address encoder 110, a first lookup table 112, a second lookup table 114, and an overflow handling module 120. The pixel counter 102, the line counter 104, and the frame counter 106 are utilized for performing counting of a pixel clock, a line pulse, and a frame pulse being processed by the dithering circuit 100, respectively. The pixel counter 102 generates a 1-bit pixel count PN, the line counter 104 generates a 2-bit line count LN, and the frame counter 106 generates a 2-bit frame count FN. The data segmenting module 108 is utilized for splitting a 10-bit first odd pixel parameter ON1 into a 6-bit second odd pixel parameter ON2 and a 4-bit third odd pixel parameter ON3, and for splitting a 10-bit first even pixel parameter EN1 into a 6-bit second odd pixel parameter EN2 and a 4-bit third odd pixel parameter EN3. The four bits of the third odd pixel parameter ON3 are four bits having lowest weight of the 10-bit first odd pixel parameter ON1, namely the four least significant bits (LSBs). The four bits of the third even pixel parameter EN3 are four bits having lowest weight of the 10-bit first even pixel parameter EN1. The lookup table address encoder 110 combines the 4-bit third odd pixel parameter ON3 and third even pixel parameter EN3 with the 1-bit pixel count PN, the 2-bit line count LN, and the 2-bit frame count FN generated by the pixel counter 102, line counter 104, and frame counter 106, respectively, to generate a 9-bit odd pixel index parameter Index_Odd or a 9-bit even pixel index parameter Index_Even, respectively. The first lookup table 112 corresponds to the odd pixels, and stores a large number of odd pixel dithering parameters. The second lookup table 114 corresponds to the even pixels, and stores a large number of even pixel dithering parameters. The first lookup table 112 looks up a corresponding 1-bit odd pixel dithering parameter DO according to the odd pixel index parameter Index_Odd generated by the lookup table address encoder 110. The second lookup table 114 looks up a corresponding 1-bit even pixel dithering parameter DE according to the even pixel index parameter Index_Even generated by the lookup table address encoder 110. A first adder 122 adds the 6-bit second odd pixel parameter ON2 and the 1-bit odd pixel dithering parameter DO representing an odd pixel to generate a fourth odd pixel parameter ON4. The overflow handling module 120 determines whether the fourth odd parameter ON4 generates an overflow. If no overflow occurs, the six least significant bits of the fourth odd pixel parameter ON4, namely six bits of the fourth odd pixel parameter ON4 counted backward from the last bit thereof, may be directly outputted as a 6-bit output odd pixel parameter ON5. If overflow occurs in the fourth odd pixel parameter ON4, an upper threshold number of the 6-bit output odd pixel parameter ON5 is outputted, such as a binary sequence "111111", which corresponds to 63 in decimal. A second adder 124 adds the 6-bit second even pixel parameter EN2 and the 1-bit even pixel dithering parameter DE representing an even pixel to generate a fourth even pixel parameter EN4. The overflow handling module 120 determines whether the fourth even parameter EN4 generates an overflow for determining a value of an output even pixel parameter EN5 and handling a similar overflow process to that described above for the fourth odd pixel parameter ON4.

It can be seen from FIG. 1 that the first lookup table 112 and the second lookup table 114 form a heavy burden on memory utilized by the dithering circuit 100, as the lookup parameters utilized by the first lookup table 112 or the second lookup table 114 must use four least significant bits from the original pixel data, and odd pixels and even pixels must be handled separately during lookup. For example, the lookup parameter Index_Odd utilized by the first lookup table 112 takes up nine bits, and each dithering parameter stored takes up one bit. Thus, the first lookup table 112 has a size of $2^9\times1$, for a total of 512 bits. The second lookup table 114 will also have a size of 512 bits. In other words, when the dithering circuit 100 is responsible for handling a single color subpixel, the amount of memory required is 512+512=1024 bits. If a normal RGB (red-green-blue) display requires three dithering circuits 100 for handling each colored subpixel, respectively, the total amount of memory required becomes 1024×3=3072 bits. Further, as memory requirements increase, greater circuit area is required, leading to higher hardware costs. Thus, the dithering circuit 100 shown in FIG. 1 has great room for improvement.

SUMMARY OF THE INVENTION

According to an embodiment of the present invention, a circuit for performing dithering of pixel data on a display comprises a lookup table module, a dithering parameter decoder, a first adder, a second adder, and an overflow handling module. The lookup table module is utilized for storing a lookup table. The lookup table is used for storing a plurality of binary dithering parameters. Each binary dithering parameter of the plurality of binary dithering parameters is generated by performing encoding of a corresponding odd pixel dithering parameter and a corresponding even pixel dithering parameter. The dithering parameter decoder is utilized for receiving a first dithering parameter looked up in the lookup table, and generating a second dithering parameter and a third dithering parameter from the first dithering parameter. The second dithering parameter corresponds to an odd pixel, and the third dithering parameter corresponds to an even pixel. The first adder comprises a first input terminal utilized for receiving an odd pixel parameter, and a second input terminal utilized for receiving the second dithering parameter from the dithering parameter decoder. The first adder generates a dithered odd pixel parameter according to the odd pixel parameter and the second dithering parameter. The second adder comprises a first input terminal utilized for receiving an even pixel parameter, and a second input terminal utilized for receiving the third dithering parameter from the dithering parameter decoder. The second adder generates a dithered even pixel parameter according to the even pixel parameter and the third dithering parameter. The overflow handling module is utilized for detecting overflow of the dithered odd pixel parameter and the dithered even pixel parameter. The overflow handling module generates an output odd pixel parameter according to the dithered odd pixel parameter, and generates an output even pixel parameter according to the dithered even pixel parameter for performing display on the display according to the output odd pixel parameter and the output even pixel parameter.

According to an embodiment of the present invention, in a method of performing dithering of pixel data in a display, a lookup table is established. The lookup table is utilized for storing a plurality of dithering parameters stored in binary format. Each dithering parameter of the plurality of dithering is generated by performing encoding on a corresponding odd pixel dithering parameter and a corresponding even pixel dithering parameter. A first dithering parameter looked up in the lookup table is received, and a second dithering parameter and a third dithering parameter are generated according to the first dithering parameter. The second dithering parameter corresponds to an odd pixel, and the third dithering parameter corresponds to an even pixel. A dithered odd pixel parameter is generated according to an odd pixel parameter and the second dithering parameter. A dithered even pixel parameter is generated according to an even pixel parameter and the dithered even pixel parameter. Overflow is detected in either the dithered odd pixel parameter or the dithered even pixel parameter. An output odd pixel parameter is generated according to the dithered odd pixel parameter, and an output even pixel parameter is generated according to the dithered even pixel parameter for performing display on the display according to the output odd pixel parameter and the output even pixel parameter.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 is a diagram showing values of pixel count, line count, and frame count shown in FIG. 2 as determined in one embodiment.

DETAILED DESCRIPTION

To overcome the problem of the large amount of memory utilized in the prior art for storing the lookup table utilized by the dithering circuit, which increases chip area and hardware costs, a dithering circuit and related method are disclosed. In the dithering circuit disclosed, dithering parameter utilized by odd pixels and even pixels are stored in a single lookup table. An index utilized by the lookup table does not comprise any odd pixel bits or even pixel bits from original pixel data. Thus, memory used by the lookup table can be reduced.

Figure 1:
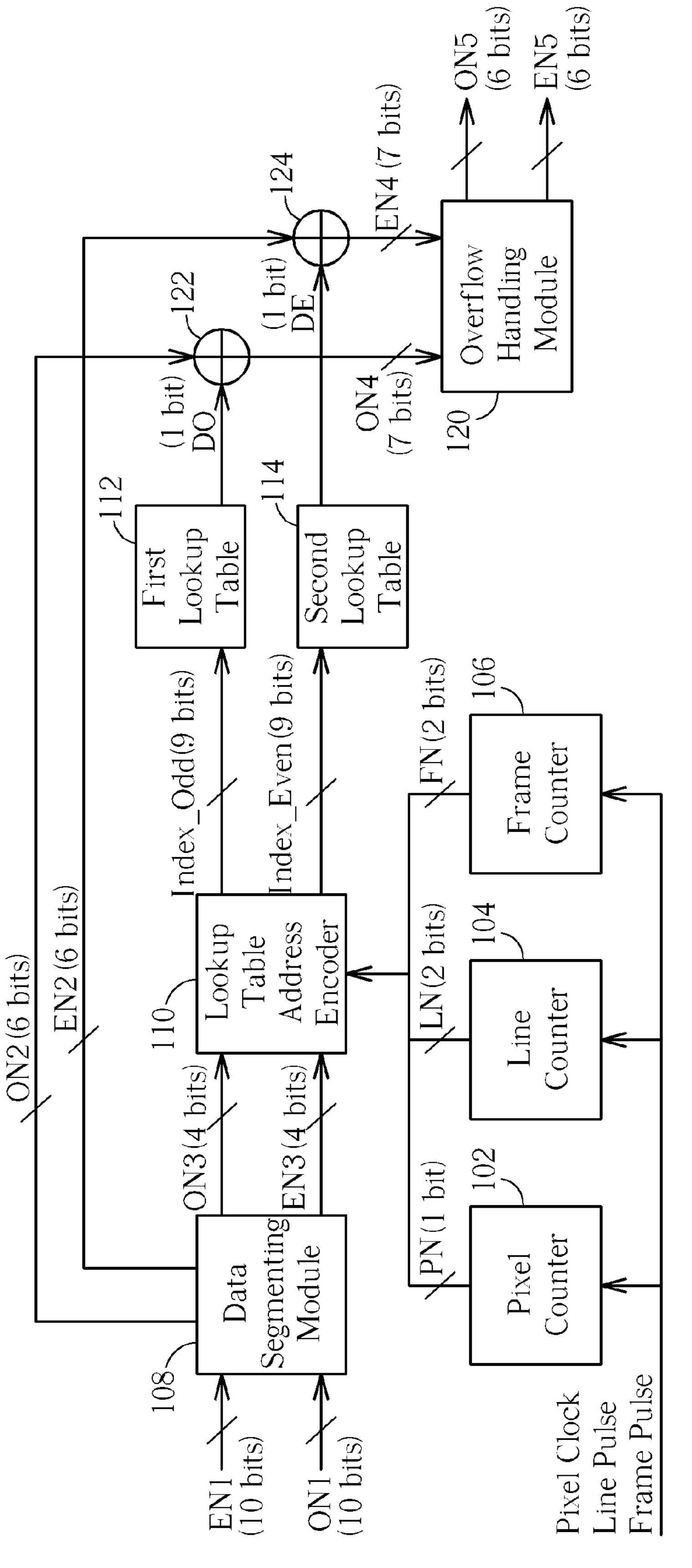
FIG. 1 PRIOR ART
FIG. 1 is a diagram of a dithering circuit utilized in the prior art.
Figure 2:
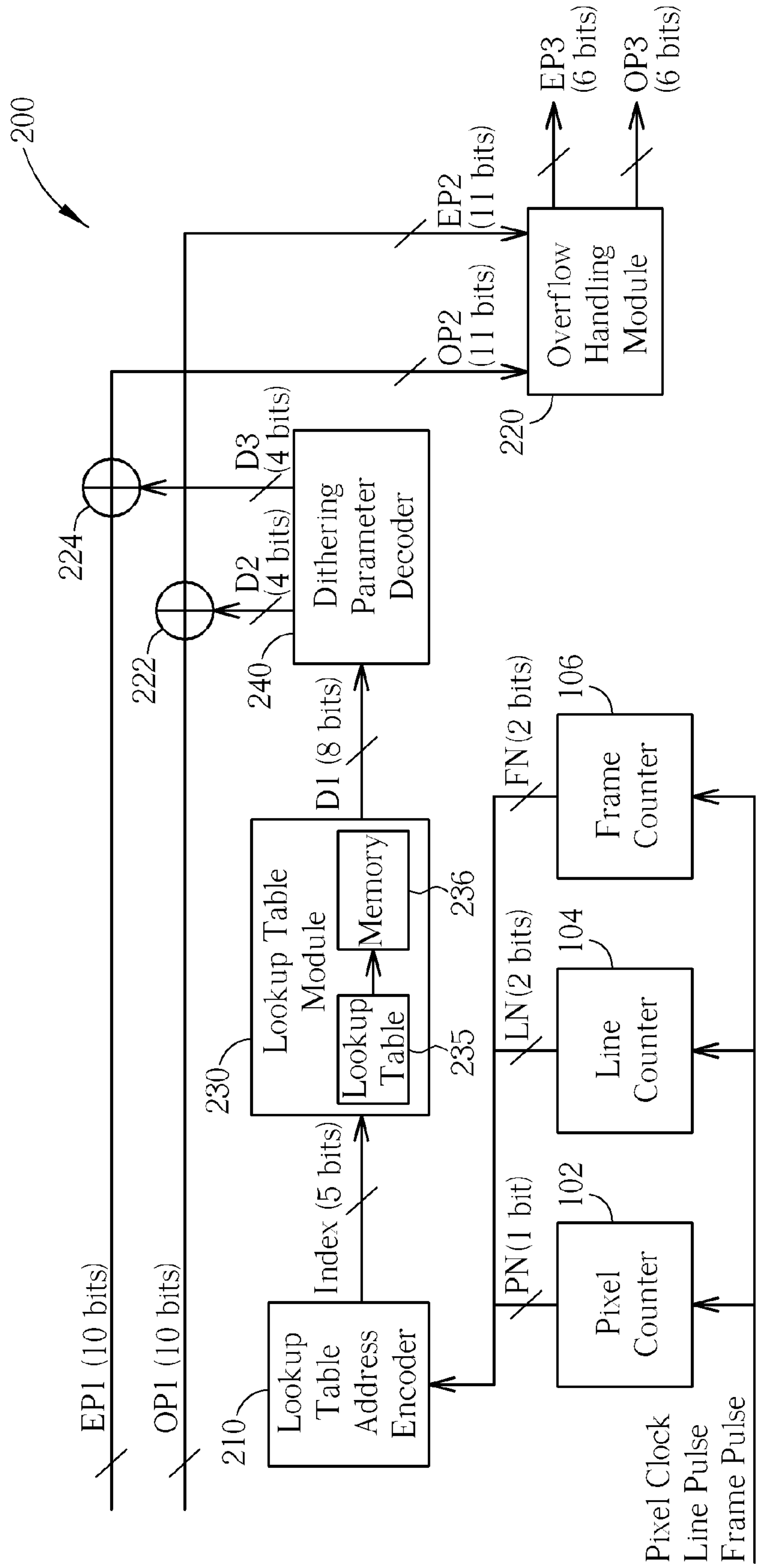
FIG. 2 is a diagram of a dithering circuit according to an embodiment of the present invention.

Please refer to FIG. 2, which is a diagram of a dithering circuit 200 according to an embodiment of the present invention. The dithering circuit 200 comprises a pixel counter 102, a line counter 104, a frame counter 106, a lookup table address encoder 210, a lookup table module 230, a dithering parameter decoder 240, an overflow handling module 220, a first adder 222, and a second adder 224. Functions of the pixel counter 102, the line counter 104, and the frame counter 106 are similar to those described for FIG. 1, and description thereof is not repeated herein. The lookup table address encoder 210 is utilized for generating an index parameter Index according to a pixel count PN generated by the pixel counter 102, a line count LN generated by the line counter 104, and a frame count FN generated by the frame counter 106. The lookup table module 230 looks up a first dithering parameter D1 corresponding to the index parameter Index in the lookup table according to the index parameter Index. The dithering parameter decoder 240 is utilized for receiving the first dithering parameter D1, and generating a second dithering parameter D2 and a third dithering parameter D3 according to the first dithering parameter D1. The second dithering parameter D2 is a dithering parameter utilized by odd pixels, and the third dithering parameter D3 is a dithering parameter utilized by even pixels. A first input end of the first encoder 222 is utilized for receiving an odd pixel parameter OP1. A second input end of the first adder 222 is utilized for receiving the second dithering parameter D2 through the dithering parameter decoder 240. The first adder 222 generates a dithered odd pixel parameter OP2 by adding the odd pixel parameter OP1 to the second dithering parameter D2. A first input end of the second adder 224 is utilized for receiving an even pixel parameter EP2. A second input end of the second adder 224 is utilized for receiving the third dithering parameter D3 through the dithering parameter decoder 240. The second adder 224 generates a dithered even pixel parameter EP2 according to the even pixel parameter EP1 and the third dithering parameter D3. The overflow handling module 220 is utilized for detecting whether or not overflow is generated in the dithered odd pixel parameter OP2 and the dithered even pixel parameter EP2. The overflow handling module 220 generates an output odd pixel parameter OP3 according to whether or not overflow occurs in the dithered odd pixel parameter OP2, and generates an output even pixel parameter EP3 according to whether or not overflow occurs in the dithered even pixel parameter EP2. Display is performed on a display according to the output odd pixel parameter OP3 and the output even pixel parameter EP3. Please note that references to bit numbers shown next to each parameter in FIG. 2 only represent one embodiment of the present invention, and are intended for illustrative purposes only, not as limitations of embodiments of the present invention.

Figure 3:
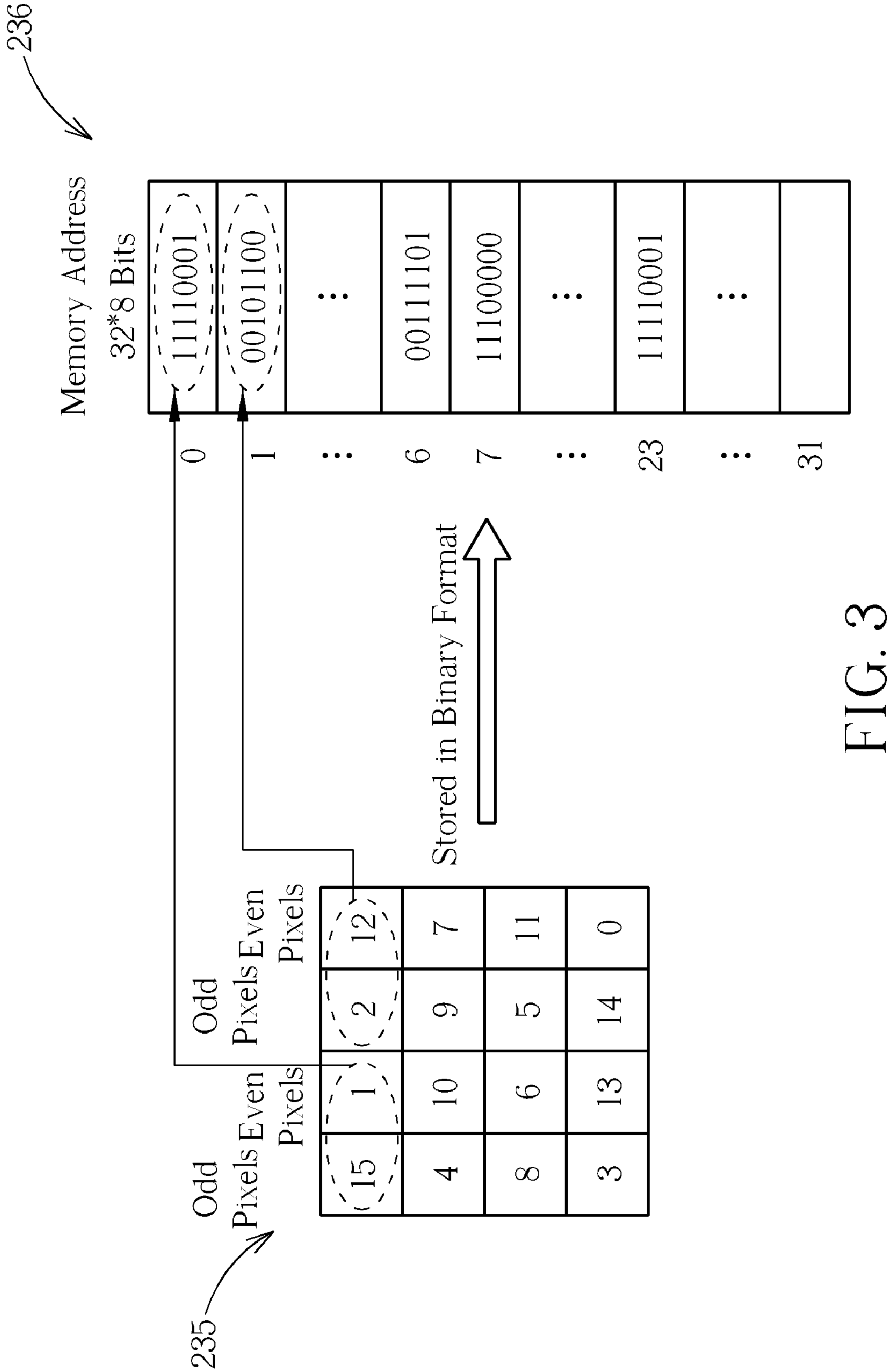
FIG. 3 is a diagram of a lookup table stored by a lookup table module of FIG. 2 and dithering parameters stored in corresponding locations thereof in memory.

Please refer to FIG. 3, which is a diagram of a lookup table stored by the lookup table module 230 of FIG. 2 and dithering parameters stored in corresponding locations thereof in memory. As shown in FIG. 3, the lookup table 235 may comprise sixteen 10-bit dithering parameters having values 0, 1, 2 . . . 15, respectively. In the lookup table 235, odd columns store dithering parameters corresponding to odd pixel parameters, e.g. 15, 4, 8, and 3 in the first column, and 2, 9, 5, and 14 in the third column. Even columns store dithering parameters corresponding to even pixel parameters, e.g. 1, 10, 6 and 13 in the second column, and 12, 7, 11, and 0 in the fourth column. When the dithering parameters stored in the lookup table 235 are to be stored in memory 236, two neighboring dithering parameters will be stored in at a same address of the memory 236, one dithering parameter corresponding to an odd column of the lookup table 235, and another dithering parameter corresponding to an even column of the lookup table 235. As shown in FIG. 3, a binary bit sequence "1111 0001" is stored at a memory address 0 of the memory 236 for storing dithering parameters having decimal values of 15 and 1 ("1111" is binary for decimal "15", and "0001" is binary for decimal "1"), namely a pair of dithering parameters stored in an upper-left corner of the lookup table 235. A binary bit sequence "0010 1100" is stored at a memory address 1 of the memory 236 for storing dithering parameters having decimal values of 2 and 12 ("0010" is binary for decimal "2", and "1100" is binary for decimal "12"), namely a pair of dithering parameters stored in an upper-right corner of the lookup table 235. Values for each binary bit sequence may be stored in a similar way at successive addresses of the memory 236. An 8-bit binary bit sequence stored at each memory address of the memory 236 represents a dithering parameter D1 shown in FIG. 2, and each dithering parameter D1 represents a neighboring odd pixel dithering parameter and even pixel dithering parameter pair in the lookup table 235. Please note that the example shown in FIG. 3 is only one embodiment showing arrangement of dithering parameters in the lookup table 235 and the memory 236, and size of the lookup table 235 and the memory 236, and is not intended to limit the size and arrangement of dithering parameters of the lookup table and the memory in other embodiments.

When the lookup table module 230 is performing a look up operation on the memory 236 for reading a dithering parameter at a specific memory address in the memory 236, an index parameter Index generated by the lookup table address encoder 210 is needed. A simple description of how the index parameter Index is generated in a preferred embodiment of the present invention follows. Please refer to FIG. 4, which is a diagram illustrating determination of values of pixel count PN, line count LN, and frame count FN shown in FIG. 2 as determined in one embodiment. As shown in FIG. 4, in a pixel table Table1, 1920 pixel numbers corresponding to pixels received by the pixel counter 102 may make up one cycle. Each time the pixel counter 102 receives a new pixel, the pixel number of the new pixel is divided by two to generate the pixel count PN, such that decimal 0 and 1 of the pixel count PN can be represented by one binary bit. In a line table Table2, 1200 line numbers corresponding to lines received by the line counter 104 may make up one cycle. Each time the line counter 104 receives a new line, the line number of the new line is divided by four to generate the line count LN, such that decimal 0 to 3 of the line count LN can be represented by two binary bits. In a frame table Table3, 8 frame numbers corresponding to frames received by the frame counter 106 may make up one cycle. Each time the frame counter 106 receives a new frame, the frame number of the new frame is divided by four to generate the frame count FN, such that decimal 0 to 3 of the frame count FN can be represented by two binary bits. Please note that the tables Table1, Table2, and Table3 described above may be stored in the pixel counter 102, the line counter 104, and the frame counter 106, respectively, of FIG. 2, and are not shown in FIG. 2. Also, the counts or parameters shown in FIG. 4 only represent one embodiment of the present invention, and should not be taken as limiting on other embodiments thereof.

When the lookup table address encoder 210 encodes the index parameter Index according to the pixel count PN, the line count LN, and the frame count FN, the lookup table address encoder 210 combines and sequences the binary bits of the pixel count PN, the line count LN, and the frame count FN to generate the index parameter Index. For example, when the 1-bit pixel count PN is equal to "1", the 2-bit line count LN is equal to "11", and the 2-bit frame count FN is equal to "10", a binary bit sequence representing the index parameter Index may be "10111", where the five bits of the index parameter Index from left to right are the two bits of the frame count FN, the two bits of the line count LN, and the one it of the pixel count PN. In decimal, the index parameter Index is equal to "23". When the lookup table module 230 receives the index parameter Index equal to decimal "23", the lookup table module 230 may look up an 8-bit dithering parameter at a memory address "23" of the memory 236. Please note that the example just described only represents one embodiment for sequencing bits of the index parameter Index encoded according to the pixel count PN, the line count LN, and the frame count FN, which is not meant to limit sequencing in other embodiments of the present invention.

After the 8-bit dithering parameter D1 is looked up in the memory 236 according to the index parameter Index, and the dithering parameter D1 is sent to the dithering parameter decoder 240, the dithering parameter decoder 240 decodes the dithering parameter D1 into a 4-bit dithering parameter D2 and a 4-bit dithering parameter D3 according to how the odd pixel dithering parameter and the even pixel dithering parameter are sequenced when combined into the dithering parameter D1 in the lookup table 235 and the memory 236. For example, when value of the dithering parameter D1 looked up according to the memory address 23 is "11110001" (decimal "241"), the dithering parameter decoder 240 first splits the value "11110001" of the dithering parameter D1 into the dithering parameter D2 having value "1111" (decimal "15") and the dithering parameter D3 having value "0001" (decimal "1") according to how the odd pixel dithering parameter and the even pixel dithering parameter of FIG. 3 are combined in the dithering parameter D1. The dithering parameter D2 corresponds to an odd pixel and the dithering parameter D3 corresponds to an even pixel. Please note that in each embodiment of the present invention, although decoding of the dithering parameter D1 into the dithering parameters D2 and D3 may be performed according to the order in which the odd pixel dithering parameter and the even pixel dithering parameter are arranged in the lookup table 235 and the memory 236 of the lookup table module 230, the odd pixel dithering parameter need not be located at the beginning of the dithering parameter D1 (having heavier weight), and the even pixel dithering parameter need not be located at the end of the dithering parameter D1 (having lighter weight). In another embodiment, the odd pixel dithering parameter may be arranged in a position of the dithering parameter D1 having lower weight, and the even pixel dithering parameter may be arranged in a position of the dithering parameter D1 having higher weight. Namely, the odd pixel dithering parameter may be located at the end of the dithering parameter D1, and the even pixel dithering parameter may be located at the beginning of the dithering parameter D1.

After the dithering parameter decoder 240 decodes the dithering parameters D2, D3, the dithering parameter D2 is added to an odd pixel parameter OP1 by the first adder 222 to generate a dithered odd pixel parameter OP2. The dithering parameter D3 may be added to an even pixel parameter EP1 by the second adder 224 to generate a dithered even pixel parameter EP2. The odd pixel parameter OP1 and the even pixel parameter EP1 are pixel data received externally, and may be the same as the odd pixel parameter ON1 and the even pixel parameter EN1 shown in FIG. 1. In one embodiment, the odd pixel parameter OP1 and the even pixel parameter EP1 may each comprise ten bits, and the dithering parameters D2, D3 may each comprise four bits, such that the dithered odd pixel parameter OP2 and the dithered even pixel parameter EP2 may each comprise eleven bits. Then, the overflow handling module 220 may detect whether or not overflow occurs in the dithered odd pixel parameter OP2 and the dithered even pixel parameter EP2, for example when a leading bit of the dithered odd pixel parameter OP2 or the dithered even pixel parameter EP2 equals "1". Then, the overflow handling module 220 may determine values of an output odd pixel parameter OP3 and an output even pixel parameter EP3 according to whether or not overflow occurs in the dithered odd pixel parameter OP2 or the dithered even pixel parameter EP2.

Please note that in one embodiment, when the odd pixel parameter OP1 and the even pixel parameter EP1 comprise ten bits, and the dithering parameters D2, D3 each comprise four bits, the first six bits of the odd pixel parameter OP1 and the even pixel parameter EP1 represent weight in front of the decimal point, and the last four bits of the odd pixel parameter OP1 and the even pixel parameter EP1 represent weight after the decimal point. Thus, the last four bits of the dithering parameters D2, D3 are also seen as weight after the decimal point. In this way, when the overflow handling module 220 generates the output odd pixel parameter OP3 and the output even pixel parameter EP3, the output odd pixel parameter OP3 and the output even pixel parameter EP3 each comprise six bits representing the six bits of the weight in front of the decimal point. In a preferred embodiment, when overflow occurs in the dithered odd pixel parameter OP2 or the dithered even pixel parameter EP2, if the overflow handling module 220 is set to output six bits, the overflow handling module 220 sets the output odd pixel parameter OP3 or the output even pixel parameter EP3 to binary "111111" (decimal "63"), namely setting all six bits of the output odd pixel parameter OP3 or the output even pixel parameter EP3 to their upper limit. In another embodiment, the upper limit may be replaced with a predetermined threshold pixel parameter.

Figure 5:
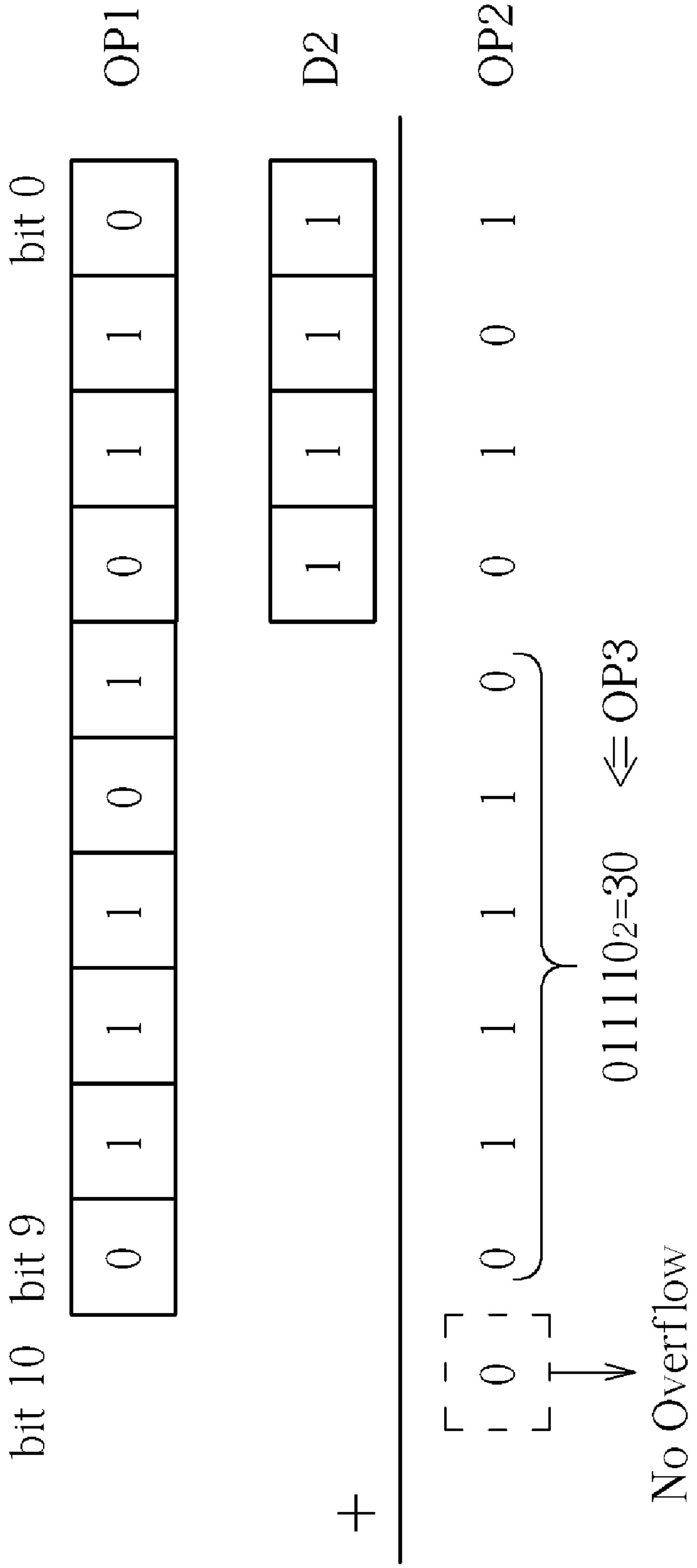
FIG. 5 is a simplified diagram illustrating operation of the first adder and the overflow handling module before overflow occurs.

Please refer to FIG. 5, which illustrates operation of the first adder 222 and the overflow handling module 220 prior to overflow occurring when the odd pixel parameter OP1 shown in FIG. 2 comprises ten bits, of which the leading six bits represent six places before the decimal point, and the dithering parameter D2 comprises four bits according to one embodiment of the present invention. As shown in FIG. 5, assume the value of the odd pixel parameter OP1 is a 10-bit binary sequence "0111010110", the value of the dithering parameter D2 in binary is "1111", and the first six bits of the odd pixel parameter OP1 are considered six bits of weight in front of the decimal point. When the odd pixel parameter OP1 and the dithering parameter D2 are added by the first adder 222 to generate the 11-bit dithered odd pixel parameter OP2 having value "00111100101", it can be seen that overflow has not occurred in the dithered odd pixel parameter OP2 after inspection by the overflow handling module 220. Thus, the value of the output odd pixel parameter OP3 is set to the leading six bits "011110" (decimal "30") of the dithered odd pixel parameter OP3 (not including the overflow bit), namely the highest weighted bits of the dithered odd pixel parameter OP2.

Figure 6:
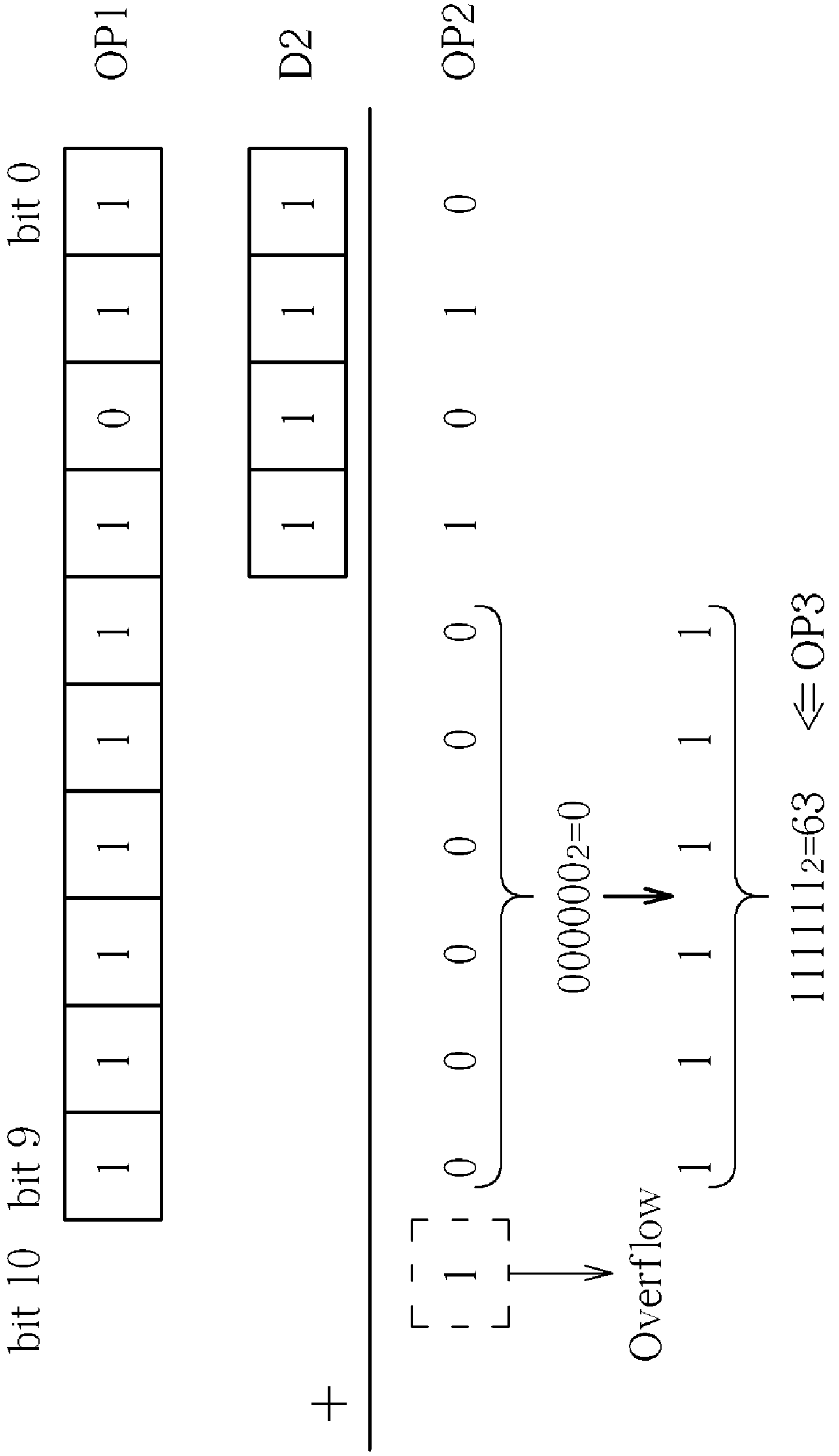
FIG. 6 is a simplified diagram illustrating operation of the first adder and the overflow handling module when overflow occurs.

Please refer to FIG. 6, which illustrates operation of the first adder 222 and the overflow handling module 220 when overflow occurs when the odd pixel parameter OP1 shown in FIG. 2 comprises ten bits, of which the leading six bits represent six places before the decimal point, and the dithering parameter D2 comprises four bits according to one embodiment of the present invention. As shown in FIG. 6, assume the value of the odd pixel parameter OP1 is a 10-bit binary sequence "1111111011", the value of the dithering parameter D2 in binary is "1111", and the first six bits of the odd pixel parameter OP1 are considered six bits of weight in front of the decimal point. When the odd pixel parameter OP1 and the dithering parameter D2 are added by the first adder 222 to generate the 11-bit dithered odd pixel parameter OP2 having value "10000001010", it can be seen that overflow has occurred in the dithered odd pixel parameter OP2 after inspection by the overflow handling module 220 (the bit having highest weight and having value "1" being an overflow bit generated when overflow occurs). Thus, the value of the output odd pixel parameter OP3 is set to six bits "111111" (decimal "63"), namely an upper limit of the 6-bit binary number.

AS can be seen from the example of FIG. 3, the memory 236 may read in a number of bits equal to four times the size of the lookup table 235 in one pass, namely 32 memory addresses times 8 bits of each memory address, for a total of 256 bits. Considering that dithering parameters utilized for each color (e.g. red, green, blue) are different, a total of only 256 bits times 3 colors, equaling 768 bits, of memory is required. Compared to the 3072 bits of memory consumed by the three colors shown in FIG. 1, the method described uses much less memory to perform dithering of subpixels of each color, and can reduce chip size and lower hardware costs over the prior art.

Figure 7:
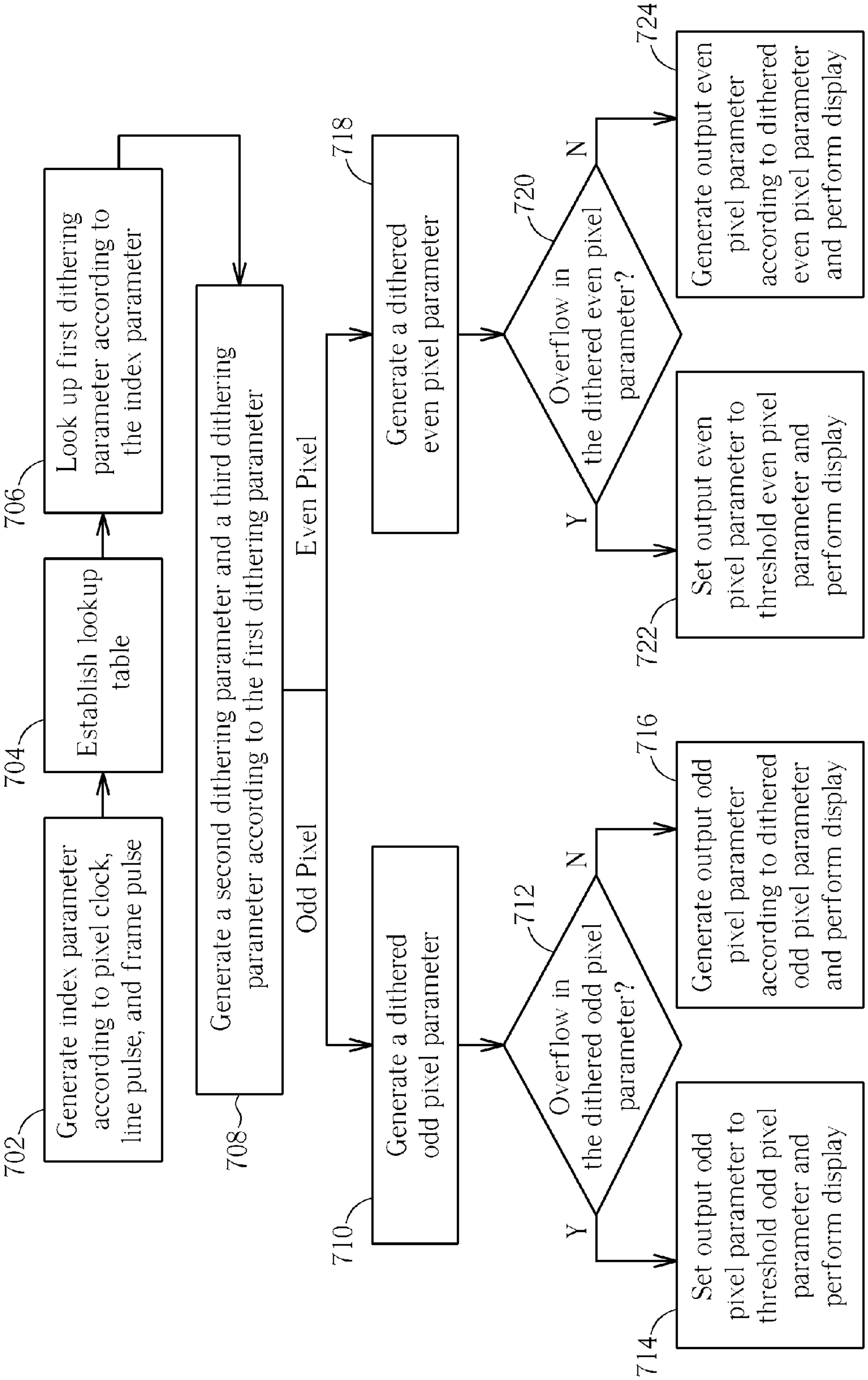
FIG. 7 is a flowchart of a method for performing dithering of pixel data according to an embodiment of the present invention.

Please refer to FIG. 7, which is a flowchart of a method of performing dithering of pixel data according to an embodiment of the present invention. As shown in FIG. 7, the method comprises the following steps:

Step 702: Generate an index parameter according to a pixel clock, a line pulse, and a frame pulse;

Step 704: Establish a lookup table utilized for storing a plurality of binary-format dithering parameters, each of which is generated by encoding a corresponding odd pixel dithering parameter and a corresponding even pixel dithering parameter;

Step 706: Look up a first dithering parameter in the lookup table according to the index parameter;

Step 708: Receive the first dithering parameter looked up in the lookup table, and generate a second dithering parameter corresponding to an odd pixel and a third dithering parameter corresponding to an even pixel according to the first dithering parameter;

Step 710: Generate a dithered odd pixel parameter according to the odd pixel parameter and the second dithering parameter;

Step 712: Determine if the dithered odd pixel parameter generates overflow; if overflow is detected, proceed to Step 714; else proceed to Step 716;

Step 714: Set an output odd pixel parameter to a threshold odd pixel parameter and perform display in a display according to the output odd pixel parameter;

Step 716: Generate the output odd pixel parameter according to the dithered odd pixel parameter, and perform display in the display according to the output odd pixel parameter;

Step 718: Generate a dithered even pixel parameter according to the even pixel parameter and the third dithering parameter;

Step 720: Determine if the dithered even pixel parameter generates overflow; if overflow is detected, proceed to Step 722; else proceed to Step 724;

Step 722: Set an output even pixel parameter to a threshold even pixel parameter and perform display in a display according to the output even pixel parameter; and Step 724: Generate the output even pixel parameter according to the dithered even pixel parameter, and perform display in the display according to the output even pixel parameter.

The steps shown in FIG. 7 may represent one embodiment of the present invention, and the steps may be combined and ordered differently to generate other embodiments. Embodiments extrapolated by applying various limitations to the steps of FIG. 7 based on the technical characteristics described above should also be considered part of the scope of the present invention.

A method and circuit for performing dithering of pixel data on a display are described above. Compared to the prior art, the embodiments of the present invention utilize the pixel count, line count, and frame count generated according to the pixel clock, the line pulse, and the frame pulse to generate the index utilized for storing the dithering parameters, without needing to utilize the inputted odd pixel parameter or even pixel parameter as bits comprised in the index. Thus, area and hardware costs dedicated to memory used are shrunk dramatically. In addition, the dithering parameters needed by the odd pixel parameter and the even pixel parameter are stored first in the same lookup table, which also helps to reduce memory area and hardware costs.

Those skilled in the art will readily observe that numerous modifications and alterations of the device and method may be made while retaining the teachings of the invention.

What is claimed is:

1. A circuit for performing dithering of pixel data on a display, the circuit comprising:

a lookup table module utilized for storing a lookup table, the lookup table used for storing a plurality of binary dithering parameters, each binary dithering parameter of the plurality of binary dithering parameters generated by performing encoding of a corresponding odd pixel dithering parameter and a corresponding even pixel dithering parameter;

a dithering parameter decoder utilized for receiving a first dithering parameter looked up in the lookup table, and generating a second dithering parameter and a third dithering parameter from the first dithering parameter, wherein the second dithering parameter corresponds to an odd pixel, and the third dithering parameter corresponds to an even pixel;

a first adder comprising:

a first input terminal utilized for receiving an odd pixel parameter; and a second input terminal utilized for receiving the second dithering parameter from the dithering parameter decoder;

wherein the first adder generates a dithered odd pixel parameter according to the odd pixel parameter and the second dithering parameter;

a second adder comprising:

a first input terminal utilized for receiving an even pixel parameter; and a second input terminal utilized for receiving the third dithering parameter from the dithering parameter decoder;

wherein the second adder generates a dithered even pixel parameter according to the even pixel parameter and the third dithering parameter; and an overflow handling module utilized for detecting overflow of the dithered odd pixel parameter and the dithered even pixel parameter, the overflow handling module generating an output odd pixel parameter according to the dithered odd pixel parameter, and generating an output even pixel parameter according to the dithered even pixel parameter for performing display on the display according to the output odd pixel parameter and the output even pixel parameter.

2. The circuit of claim 1, further comprising:

a lookup table address encoder for generating an index parameter;

wherein the lookup table module looks up the first dithering parameter in the lookup table according to the index parameter.

3. The circuit of claim 2, further comprising:

a pixel counter for generating a pixel count according to a pixel clock;

a line counter for generating a line count according to a line pulse; and a frame counter for generating a frame count according to a frame pulse;

wherein the lookup table address encoder generates the index parameter according to the pixel count, the line count, and the frame count.

4. The circuit of claim 3, wherein the pixel count, the line count, and the frame count are stored in binary, and the lookup table address encoder generates the index parameter by combining and sequencing bits of the pixel count, the line count, and the frame count.

5. The circuit of claim 1, wherein each dithering parameter stored in the lookup table is generated by combining and sequencing bits of the odd pixel dithering parameter and bits of the even pixel dithering parameter corresponding to each dithering parameter, and the dithering parameter decoder generates the second dithering parameter according to position of the bits of the odd pixel dithering parameter in each dithering parameter, and generates the third dithering parameter according to position of the bits of the even pixel dithering parameter in each dithering parameter.

6. The circuit of claim 5, wherein each dithering parameter is generated by appending the even pixel dithering parameter after the odd pixel dithering parameter for making weight of the bits of the odd pixel dithering parameter greater than weight of the bits of the even pixel dithering parameter for each dithering parameter, and the dithering parameter decoder generates the second dithering parameter according to a front half of bits of each dithering parameter corresponding to the odd pixel dithering parameter, and generates the third dithering parameter according to a back half of the bits of each dithering parameter corresponding to the even pixel dithering parameter.

7. The circuit of claim 5, wherein each dithering parameter is generated by appending the odd pixel dithering parameter after the even pixel dithering parameter for making weight of the bits of the even pixel dithering parameter greater than weight of the bits of the odd pixel dithering parameter for each dithering parameter, and the dithering parameter decoder generates the third dithering parameter according to a front half of bits of each dithering parameter corresponding to the even pixel dithering parameter, and generates the second dithering parameter according to a back half of the bits of each dithering parameter corresponding to the odd pixel dithering parameter.

8. The circuit of claim 1, wherein when the overflow handling module detects overflow generated in the dithered odd pixel parameter, the output odd pixel parameter is set to a threshold odd pixel parameter.

9. The circuit of claim 1, wherein when the overflow handling module detects overflow generated in the dithered even pixel parameter, the output even pixel parameter is set to a threshold even pixel parameter.

10. A method of performing dithering of pixel data in a display, the method comprising:

establishing a lookup table, the lookup table utilized for storing a plurality of dithering parameters stored in binary format, each dithering parameter of the plurality of dithering generated by performing encoding on a corresponding odd pixel dithering parameter and a corresponding even pixel dithering parameter;

receiving a first dithering parameter looked up in the lookup table, and generating a second dithering parameter and a third dithering parameter according to the first dithering parameter, the second dithering parameter corresponding to an odd pixel, and the third dithering parameter corresponding to an even pixel;

generating a dithered odd pixel parameter according to an odd pixel parameter and the second dithering parameter;

generating a dithered even pixel parameter according to an even pixel parameter and the dithered even pixel parameter;

detecting overflow in either the dithered odd pixel parameter or the dithered even pixel parameter; and generating an output odd pixel parameter according to the dithered odd pixel parameter, and generating an output even pixel parameter according to the dithered even pixel parameter for performing display on the display according to the output odd pixel parameter and the output even pixel parameter.

11. The method of claim 10, further comprising:

generating an index parameter; and looking up the first dithering parameter in the lookup table according to the index parameter.

12. The method of claim 11, further comprising:

generating a pixel count according to a pixel clock;

generating a line count according to a line pulse; and generating a frame count according to a frame pulse;

wherein the index sequence is generated according to the pixel count, the line count, and the frame count.

13. The method of claim 12, wherein the pixel count, the line count, and the frame count are stored in binary, and generating the index parameter comprises combining and sequencing bits of the pixel count, the line count, and the frame count.

14. The method of claim 10, wherein establishing the lookup table comprises:

combining and sequencing bits of the odd pixel dithering parameter and bits of the even pixel dithering parameter corresponding to each dithering parameter for generating each dithering parameter stored in the lookup table;

wherein receiving the first dithering parameter looked up in the lookup table, and generating a second dithering parameter and a third dithering parameter according to the first dithering parameter comprises:

generating the second dithering parameter according to position of the bits of the odd pixel dithering parameter in each dithering parameter, and generating the third dithering parameter according to position of the bits of the even pixel dithering parameter in each dithering parameter.

15. The method of claim 14, wherein combining and sequencing the bits of the odd pixel dithering parameter and the bits of the even pixel dithering parameter corresponding to each dithering parameter for generating each dithering parameter stored in the lookup table comprises:

appending the even pixel dithering parameter corresponding to each dithering parameter stored in the lookup table after the odd pixel dithering parameter of each dithering parameter for generating each dithering parameter stored in the lookup table for making weight of the bits of the odd pixel dithering parameter greater than weight of the bits of the even pixel dithering parameter in each dithering parameter;

wherein generating the second dithering parameter according to the position of the bits of the odd pixel dithering parameter in each dithering parameter, and generating the third dithering parameter according to the position of the bits of the even pixel dithering parameter in each dithering parameter comprises:

generating the second dithering parameter according to a front half of bits of each dithering parameter corresponding to the odd pixel dithering parameter, and generating the third dithering parameter according to a back half of the bits of each dithering parameter corresponding to the even pixel dithering parameter.

16. The method of claim 14, wherein combining and sequencing the bits of the odd pixel dithering parameter and the bits of the even pixel dithering parameter corresponding to each dithering parameter for generating each dithering parameter stored in the lookup table comprises:

appending the odd pixel dithering parameter corresponding to each dithering parameter stored in the lookup table after the even pixel dithering parameter of each dithering parameter for generating each dithering parameter stored in the lookup table for making weight of the bits of the even pixel dithering parameter greater than weight of the bits of the odd pixel dithering parameter in each dithering parameter;

wherein generating the second dithering parameter according to the position of the bits of the odd pixel dithering parameter in each dithering parameter, and generating the third dithering parameter according to the position of the bits of the even pixel dithering parameter in each dithering parameter comprises:

generating the third dithering parameter according to a front half of bits of each dithering parameter corresponding to the even pixel dithering parameter, and generating the second dithering parameter according to a back half of the bits of each dithering parameter corresponding to the odd pixel dithering parameter.

17. The method of claim 10, wherein generating the output odd pixel parameter according to the dithered odd pixel parameter, and generating the output even pixel parameter according to the dithered even pixel parameter for performing display on the display according to the output odd pixel parameter and the output even pixel parameter comprises:

setting the output odd pixel parameter to a threshold odd pixel parameter upon detecting overflow generated in the dithered odd pixel parameter.

18. The method of claim 10, wherein generating the output odd pixel parameter according to the dithered odd pixel parameter, and generating the output even pixel parameter according to the dithered even pixel parameter for performing display on the display according to the output odd pixel parameter and the output even pixel parameter comprises:

setting the output even pixel parameter to a threshold even pixel parameter upon detecting overflow generated in the dithered even pixel parameter.

* * * * *